(12) United States Patent
Shirakawa et al.

(10) Patent No.: US 7,663,200 B2
(45) Date of Patent: Feb. 16, 2010

(54) INTEGRATED CIRCUIT DEVICE PACKAGING STRUCTURE AND PACKAGING METHOD

(75) Inventors: Yasufumi Shirakawa, Osaka (JP); Masaki Taniguchi, Kyoto (JP); Hideo Fukuda, Kyoto (JP); Yuzo Shimizu, Osaka (JP); Shinya Esaki, Osaka (JP)

(73) Assignee: Panasonic Corporation, Osaka (JP)

( * ) Notice: Subject to any disclaimer, the term of this patent is extended or adjusted under 35 U.S.C. 154(b) by 602 days.

(21) Appl. No.: 11/073,726

(22) Filed: Mar. 8, 2005

(65) Prior Publication Data

US 2005/0151216 A1 Jul. 14, 2005

Related U.S. Application Data

(62) Division of application No. 10/418,204, filed on Apr. 18, 2003, now abandoned.

(30) Foreign Application Priority Data

Apr. 18, 2002 (JP) ................................ 2002-116321

(51) Int. Cl.
*H01L 21/02* (2006.01)
(52) U.S. Cl. .................. 257/434; 257/99; 257/431; 257/680; 257/E31.117; 257/E33.056; 257/E33.057; 257/E33.058; 438/57; 438/64; 438/116; 438/127
(58) Field of Classification Search .................. 355/69, 355/67; 257/92, 434, 431, 433, E31.117, 257/99, 680, E33.056, E33.057, E33.058; 438/57, 64, 116, 127
See application file for complete search history.

(56) References Cited

U.S. PATENT DOCUMENTS 5,166,755 A * 11/1992 Gat ............................. 356/419

| | | | |
|---|---|---|---|
| 5,786,589 A | 7/1998 | Segawa et al. ............ 250/208.1 |
| 6,188,130 B1 | 2/2001 | Ramirez et al. ............. 257/706 |
| 6,379,988 B1 * | 4/2002 | Peterson et al. ................ 438/51 |
| 6,396,116 B1 * | 5/2002 | Kelly et al. .................. 257/432 |
| 6,407,456 B1 | 6/2002 | Ball ........................... 257/777 |
| 6,483,652 B2 | 11/2002 | Nakamura ................... 359/819 |

(Continued)

FOREIGN PATENT DOCUMENTS

JP 55-165683 12/1980

(Continued)

OTHER PUBLICATIONS

Chinese Office Action, with English translation, issued in Chinese Patent Application No. CN 2005113649.5, mailed Jul. 6, 2007.

(Continued)

*Primary Examiner*—Matthew C Landau
*Assistant Examiner*—Colleen E Snow
(74) *Attorney, Agent, or Firm*—McDermott Will & Emery LLP (57) ABSTRACT

A packaging structure suitable for an integrated circuit device receiving short-wavelength laser light is provided. A lead-mounted substrate is placed on the side of the light receiving surface of the integrated circuit device having a photo detecting part. The lead is electrically connected with the integrated circuit device via an electrode. The integrated circuit device and the substrate are encapsulated with an encapsulation section. The substrate has an opening at a position above the photo detecting part.

2 Claims, 6 Drawing Sheets

U.S. PATENT DOCUMENTS

| | | | |
|---|---|---|---|
| 6,492,699 B1 * | 12/2002 | Glenn et al. | 257/433 |
| 6,650,006 B2 | 11/2003 | Huang et al. | 257/686 |
| 6,661,571 B1 | 12/2003 | Shioda et al. | 359/372 |
| 6,710,376 B2 * | 3/2004 | Worley | 257/92 |
| 6,800,946 B2 * | 10/2004 | Chason et al. | 257/778 |
| 6,900,880 B2 * | 5/2005 | Kida et al. | 355/67 |
| 6,924,540 B2 * | 8/2005 | Shirakawa et al. | 257/434 |
| 2003/0098959 A1 * | 5/2003 | Hagiwara et al. | 355/69 |

FOREIGN PATENT DOCUMENTS

| | | |
|---|---|---|
| JP | 61-110150 | 5/1988 |
| JP | 01-251754 | 10/1989 |
| JP | 01-303745 | 12/1989 |
| JP | 05-6989 | 1/1993 |
| JP | 07-312463 | 11/1995 |
| JP | 09506712 | 6/1997 |
| JP | 11-068170 | 3/1999 |
| JP | 2001-250889 | 9/2001 |
| JP | 2002-093295 | 3/2002 |

OTHER PUBLICATIONS

Japanese Office Action, and English translation thereof, issued on Aug. 28, 2007 for Japanese Patent Application No. 2002-116321.

* cited by examiner

An object of the present invention is providing a packaging structure suitable for an integrated circuit device receiving short-wavelength laser light, and a packaging method for the integrated circuit device.

INTEGRATED CIRCUIT DEVICE PACKAGING STRUCTURE AND PACKAGING METHOD

RELATED APPLICATIONS

This application is a divisional of U.S. patent application Ser. No. 10/418,204, filed Apr. 18, 2003, now abandoned, which claims priority of Japanese Patent Application No. 2002-116321, filed Apr. 18, 2002, which is incorporated herein by reference.

BACKGROUND OF THE INVENTION

The present invention relates to a packaging structure of an integrated circuit device having a photo detecting part, such as an amplifier-embedded light receiving device for an optical disk unit.

Figure 7:
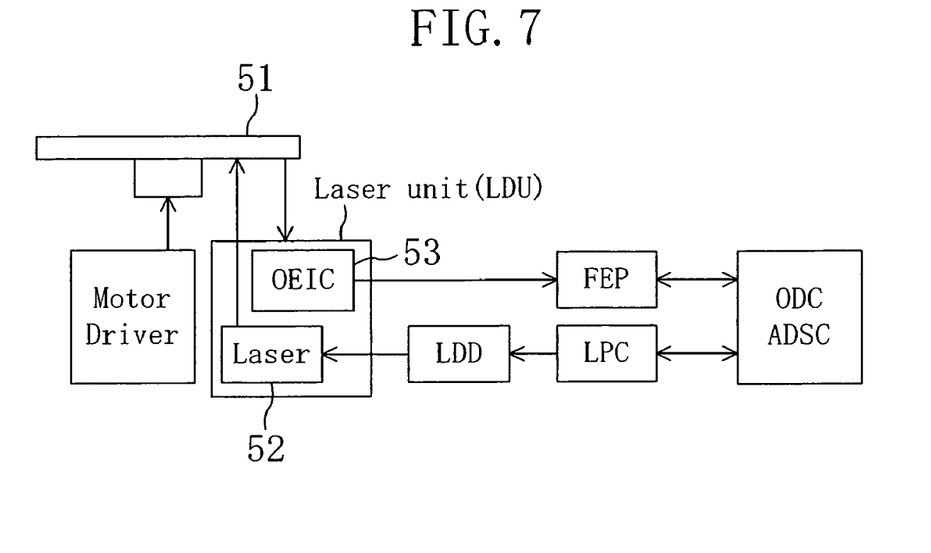
FIG. 7 is a block diagram of an optical disk unit having a laser unit.

FIG. 7 is a block diagram of an optical disk unit having a laser unit (LDU) shown in terms of functions. Referring to FIG. 7, the laser unit includes a laser device 52 and an integrated circuit device 53 having a photo detecting part (optoelectronic integrated circuit (OEIC)). Laser light is emitted from the laser device 52 toward an optical disk 51, and reflected light from the optical disk 51 is received by the photo detecting part of the integrated circuit device 53.

For improvement of the recording density of an optical disk, the beam diameter of laser light for irradiation of the optical disk has been narrowed. For attaining a narrower beam diameter, the wavelength of laser light has been gradually made shorter. For example, while the laser wavelength was 780 nm for CDs, it is 650 nm for DVDs. For next-generation DVDs, a further short laser wavelength is used for higher density.

The inventors of the present invention set out prototype fabrication and experiments using short-wavelength blue laser, and in this relation, the following problem was found. That is, a transparent resin was used for encapsulation of a device, as used for conventional OEICs for DVDs. In this case, however, the transparent resin was partly deformed/degraded when it was irradiated with short-wavelength blue laser light.

The above problem did not occur in the conventional OEICs for DVDs. The cause for this problem has not yet been clarified, but presumed pertinent to this problem as one factor is that with the shortened wavelength of the laser light, the energy of the laser light increases from the conventional level, causing generation of heat from the light absorbed into the resin.

SUMMARY OF THE INVENTION

An object of the present invention is providing a packaging structure suitable for an integrated circuit device receiving short-wavelength laser light, and a packaging method for the integrated circuit device.

Specifically, the packaging structure of an integrated circuit device of the present invention includes: an integrated circuit device having a photo detecting part; a substrate placed on the photo detecting part side of the integrated circuit device, the substrate being provided with at least one lead, at least one of the lead being electrically connected with the integrated circuit device via an electrode; and an encapsulation section for encapsulating the integrated circuit device and the substrate, wherein the substrate has an opening formed above the photo detecting part.

The substrate is preferably provided with a bypass capacitor.

The bypass capacitor is preferably formed on a surface of the substrate. Alternatively, the bypass capacitor is preferably formed in a surface portion of the substrate. The bypass capacitor is preferably formed to be in contact with two leads for which bypassing is performed.

In the packaging structure of the present invention, an optical component is preferably placed in the opening of the substrate.

The optical component is preferably a hologram device, a wavelength selective filter or a lens. The optical component is preferably secured in the opening of the substrate with a screw structure. Alternatively, the optical component is preferably secured in the opening of the substrate with a bonding member.

In the packaging structure of the present invention, the opening of the substrate is preferably provided with a shutter that can be opened/closed and blocks light incident on the photo detecting part in its closed state. The shutter is preferably formed of a liquid crystal material.

In the packaging structure of the present invention, the integrated circuit device preferably has a light emitting part on the side of its light receiving surface. The light emitting part is preferably a laser device.

The substrate preferably has a second opening formed above the light emitting part. The second opening is preferably provided with a shutter that can be opened/closed and blocks light emitted from the light emitting part in its closed state. The shutter is preferably formed of a liquid crystal material.

In the packaging structure of the present invention, at least part of the back surface of the integrated circuit device is preferably exposed from the encapsulation section.

In the packaging structure of the present invention, a heat dissipating member is preferably placed on the back surface side of the integrated circuit device to be in contact with the integrated circuit device and is encapsulated with the encapsulation section together with the integrated circuit device. At least part of the heat dissipating member is preferably exposed from the encapsulation section.

In the packaging structure of the present invention, a second integrated circuit device is preferably placed on the back surface side of the integrated circuit device to be integral with the integrated circuit device and is encapsulated with the encapsulation section together with the integrated circuit device. Preferably, a heat dissipating member is interposed between the integrated circuit device and the second integrated circuit device, and at least part of the heat dissipating member is exposed from the encapsulation section.

In the packaging structure of the present invention, preferably, a hollow defined by the encapsulation section as a side wall is formed between the substrate and the integrated circuit, and the encapsulation section has a through hole formed to allow the hollow to communicate with the outside of the packaging structure. The axis of the through hole is preferably approximately parallel to the movement direction of a pickup when the packaging structure is used as the pickup.

In the packaging structure of the present invention, at least part of the surface of the substrate on the side of the integrated circuit device is preferably subjected to antireflection treatment. Antireflection coating is preferably performed as the antireflection treatment. Alternatively, satin finish is preferably performed as the antireflection treatment.

The packaging method for an integrated circuit device of the present invention includes the steps of: (1) forming an integrated circuit device having a photo detecting part; (2)

forming a substrate having at least one lead and an opening; (3) placing the substrate on the photo detecting part side of the integrated circuit device so that the opening is located above the photo detecting part, and electrically connecting the integrated circuit device with at least one of the lead of the substrate via an electrode; and (4) encapsulating the substrate and the integrated circuit device, wherein in the step (1), the position of the electrode is determined based on positional relationships between the photo detecting part and the electrode standardized for a plurality of types of integrated circuit devices.

Alternatively, the packaging structure of an integrated circuit device of the present invention includes: an integrated circuit device; a substrate placed on the principal surface side of the integrated circuit device, the substrate being provided with at least one lead, at least one of the lead being electrically connected with the integrated circuit device via an electrode; and an encapsulation section for encapsulating the integrated circuit device and the substrate, wherein the substrate is provided with a bypass capacitor.

The bypass capacitor is preferably formed on a surface of the substrate. Alternatively, the bypass capacitor is preferably formed in a surface portion of the substrate. The bypass capacitor is preferably formed to be in contact with two leads for which bypassing is performed.

DESCRIPTION OF THE PREFERRED EMBODIMENTS

Hereinafter, preferred embodiments of the present invention will be described with reference to the accompanying drawings.

Embodiment 1

Figure 1:
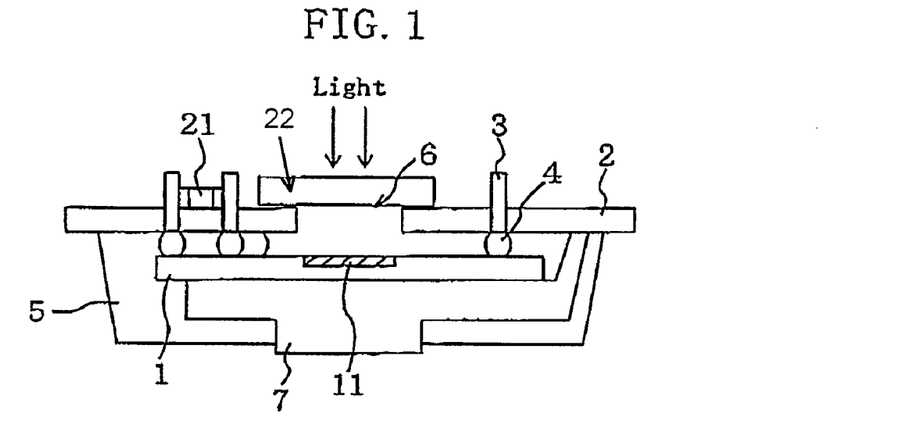
FIG. 1 is a cross-sectional view of an integrated circuit device packaging structure of Embodiment 1 of the present invention.

FIG. 1 is a cross-sectional view of an integrated circuit device packaging structure of Embodiment 1 of the present invention. Referring to FIG. 1, the packaging structure includes an integrated circuit device 1 having a photo detecting part 11, such as a photo detector and a photo diode, on the side of its light receiving surface, a substrate 2 placed on the side of the light receiving surface of the integrated circuit device 1, and an encapsulation section 5 formed of resin, for example, for encapsulating the integrated circuit device 1 and the substrate 2. Leads 3 are placed to extend through the substrate 2 and electrically connected with the integrated circuit device 1 via electrodes 4. The substrate 2 has an opening 6 at a position above the photo detecting part 11.

By adopting the structure shown in FIG. 1, the problem that the resin for encapsulation is partly deformed/degraded when irradiated with light can be avoided. This structure also provides advantages that the part of the integrated circuit device 1 other than the photo detecting part 11 is protected with the substrate 2, and that no stray light is generated due to existence of a wire because no wire is used for connection between the integrated circuit device 1 and the substrate 2.

As used herein, the "lead" refers to a component having a role of electrical conduction from an electrode of the integrated circuit device to an external terminal. The lead also has roles of dissipating heat and protecting the integrated circuit device from the external environment (for example, the lead absorbs external vibration to protect the integrated circuit device from influence of the vibration).

A bypass capacitor 21 is placed on the substrate 2 for improving the characteristics of any electronic circuit constituting the integrated circuit device 1 other than the photo detecting part 11. The effect of improving an electronic circuit is greater as the distance between the bypass capacitor 21 and the electronic circuit is shorter. In the structure shown in FIG. 1, in which the bypass capacitor 21 is formed on the surface of the substrate 2, it is possible to place the bypass capacitor 21 in the immediate vicinity of a circuit of the integrated circuit device 1. By embedding the bypass capacitor 21 in the packaging structure itself, a user intending to incorporate the packaging structure in a device system does not have to place a bypass capacitor separately. This simplifies the device system.

A heat dissipating plate 7 made of metal as the heat dissipating member is placed on the side of the back surface of the integrated circuit device 1 to be in contact with the integrated circuit device 1. The heat dissipating plate 7 is encapsulated with the encapsulation section 5, together with the integrated circuit device 1, although part thereof is exposed from the encapsulation section 5. The heat dissipating plate 7 not only improves the heat dissipation of the packaging structure but also serves as a shield.

Figure 2:
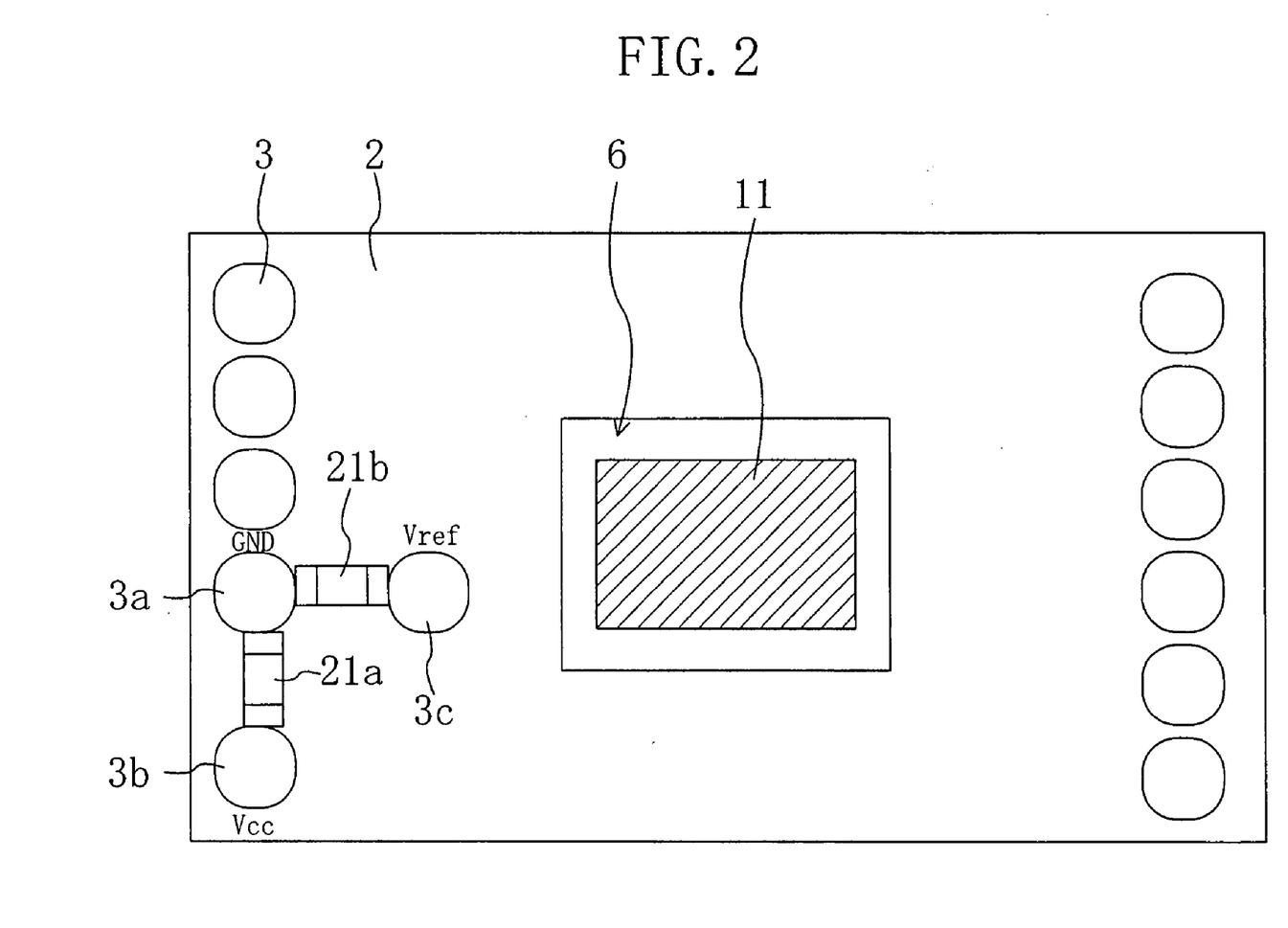
FIG. 2 is a plan view of the integrated circuit device packaging structure of Embodiment 1 of the present invention.

FIG. 2 is a plan view of the packaging structure of this embodiment. In the example shown in FIG. 2, a first bypass capacitor 21a is placed between leads 3a and 3b to be used as power supply pins, and a second bypass capacitor 21b is placed between the lead 3a and a lead 3c, among the leads 3. The first bypass capacitor 21a is in contact with the leads 3a and 3b for which bypassing is performed, and the second bypass capacitor 21b is in contact with the leads 3a and 3c for which bypassing is performed. Due to the direct contact of the bypass capacitors 21a and 21b with the leads 3a, 3b and 3c without interconnections therebetween, the effect of the bypass capacitors, 21a and 21b of improving the circuit characteristics is exhibited more significantly.

The positions of the electrodes 4 may be determined based on the positional relationships between the photo detecting part 11 and the electrodes 4 standardized for a plurality of types of integrated circuit devices. By determining in this way, the facilities and process can be simplified in fabrication of many types of integrated circuit devices.

Figure 3A:
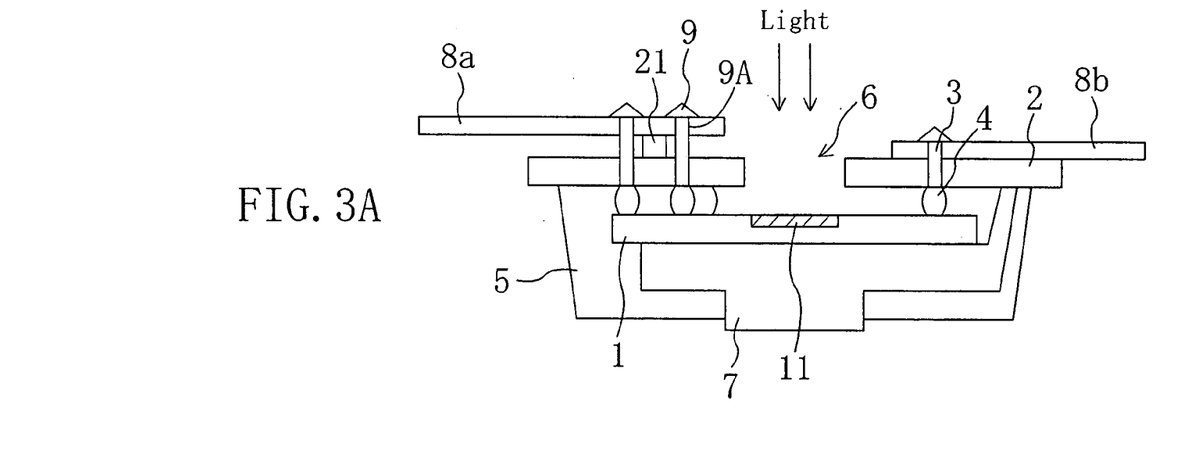
FIGS. 3A and 3B are a packaged example of the packaging structure of Embodiment 1 of the present invention.
Figure 3B:
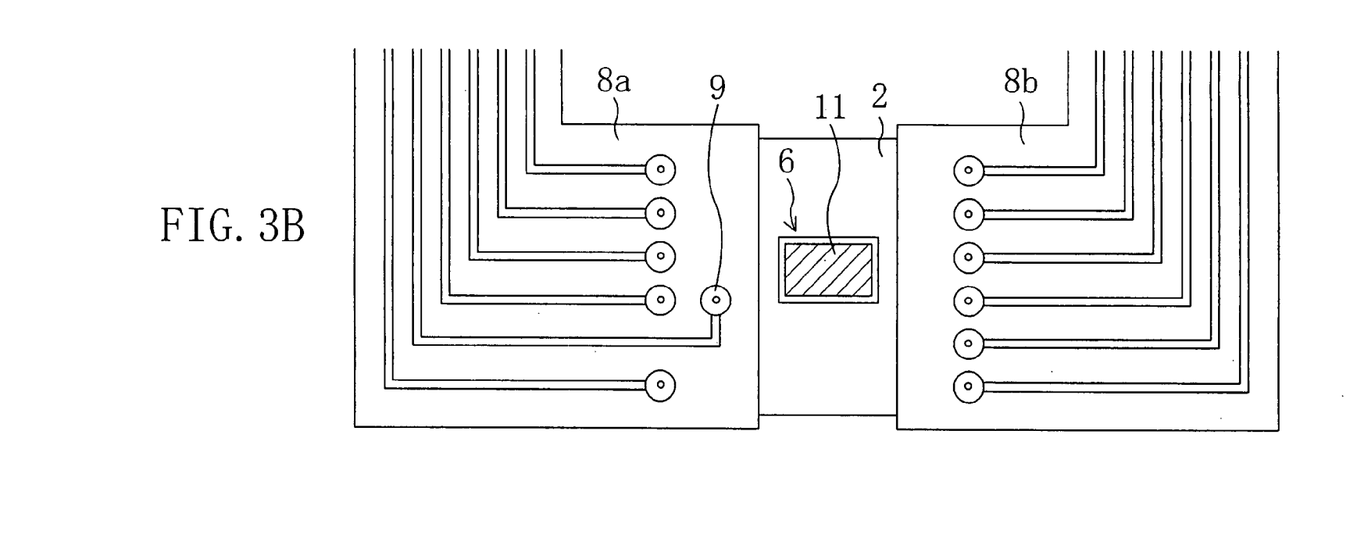

FIGS. 3A and 3B are a cross-sectional view and a plan view, respectively, of a packaged example of the packaging structure of FIGS. 1 and 2. In this example, flexible cables 8a and 8b are placed at positions above the substrate 2, and the leads 3 formed through the substrate 2 are electrically connected with the flexible cables 8a and 8b via through holes 9A with solder 9.

Figure 4A:
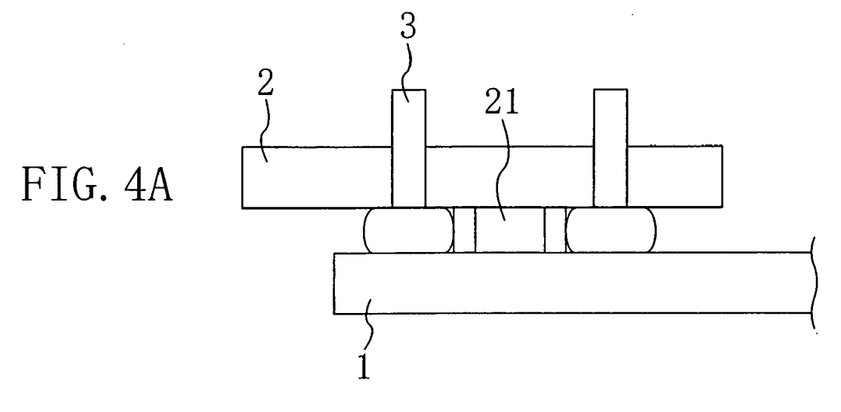
FIGS. 4A to 4C show alternative examples of placement of a bypass capacitor.
Figure 4B:
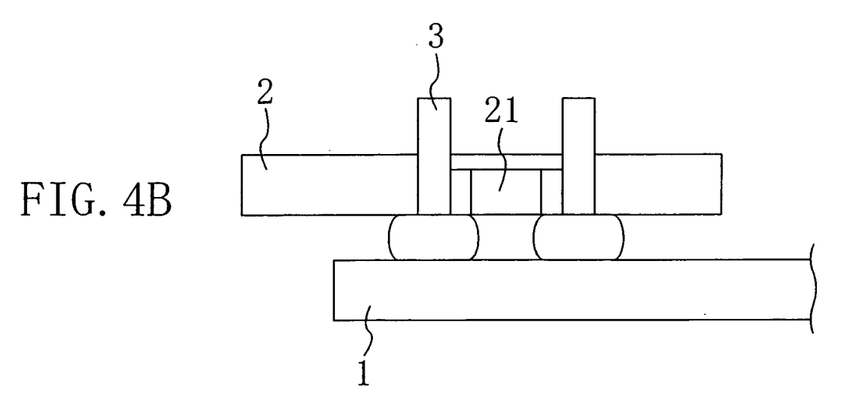
Figure 4C:
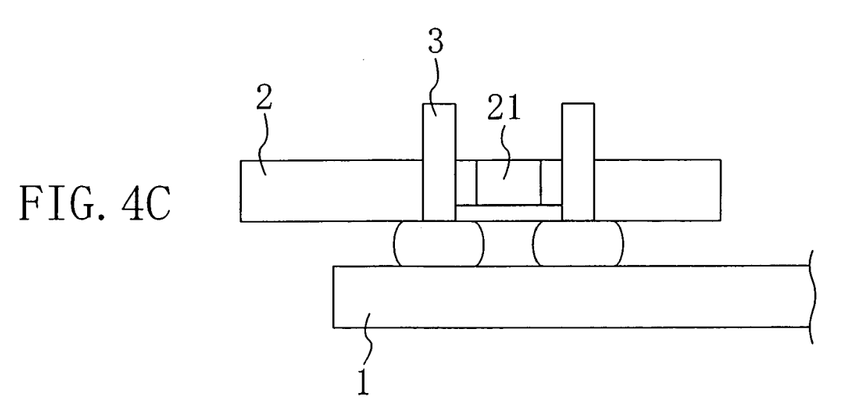

The bypass capacitor may be placed at any of various positions other than on the substrate 2. FIGS. 4A to 4C show other examples of placement of the bypass capacitor. In FIG.

4A, the bypass capacitor 21 is interposed between the integrated circuit device 1 and the substrate 2. In FIG. 4B, the bypass capacitor 21 is formed in the surface portion of the substrate 2 on the side of the integrated circuit device 1. In FIG. 4C, the bypass capacitor 21 is formed in the surface portion of the substrate 1 on the outer side opposite to the integrated circuit device 1.

The opening 6 of the substrate 2 may be provided with a shutter 22 that can be opened/closed and blocks light from being incident on the photo detecting part 11 in its closed state. The shutter 22 is preferably composed of a liquid crystal material, for example.

At least part of the surface of the substrate 2 on the side of the integrated circuit device 1 may be subjected to antireflection treatment, to eliminate generation of reflected stray light from the substrate 2. As the antireflection treatment, antireflection coating or satin finish may be performed.

At least part of the back surface of the integrated circuit device 1 may be exposed from the encapsulation section 5.

The effect obtained by providing a bypass capacitor for the substrate in this embodiment can also be provided for a packaging structure in which the integrated circuit device has no photo detecting part and thus the substrate has no opening.

Embodiment 2

Figure 5:
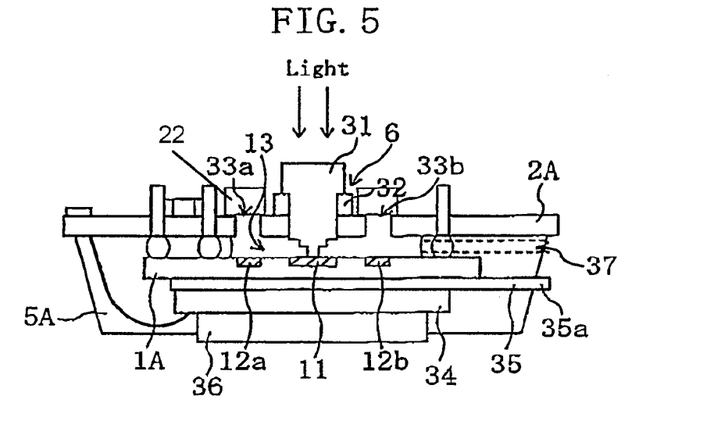
FIG. 5 is a cross-sectional view of an integrated circuit device packaging structure of Embodiment 2 of the present invention.

FIG. 5 is a cross-sectional view of an integrated circuit device packaging structure of Embodiment 2 of the present invention. The structure of FIG. 5 is based on the structure of FIG. 1 and has some new technical features added thereto.

First, an optical component such as a lens 31, for example, is placed in an opening 6 of a substrate 2A. In the illustrated example, the lens 31 is secured to the substrate 2A in the opening 6, together with a spacer 32, with a bonding member. As the optical component, a hologram device, a wavelength selective filter or the like may be placed in place of the lens 31. The optical component may be secured to the substrate 2A with a screw structure by threading both the optical component and the face of the substrate 2A exposed to the opening 6.

Figure 6A:
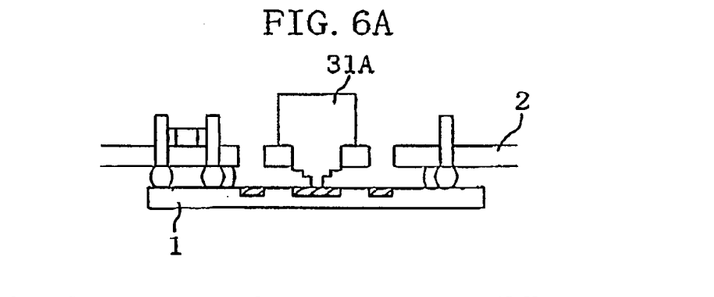
FIGS. 6A to 6C show alternative examples of placement of optical components.
Figure 6B:
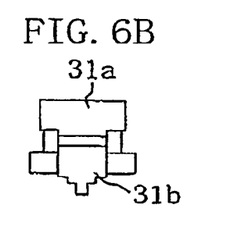
Figure 6C:
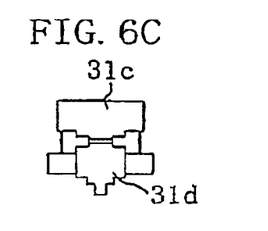
Figure 6D:
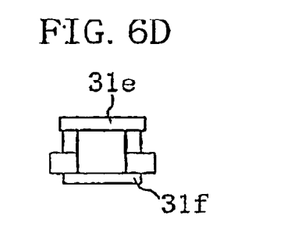

FIGS. 6A to 6D show other examples of placement of the optical component. In FIG. 6A, a lens 31A as the optical component is secured without use of a spacer. In FIG. 6B, two lenses 31a and 31b are secured. Likewise, in FIG. 6C, two lenses 31c and 31d are secured, and in FIG. 6D, two lenses 31e and 31f are secured.

Secondly, light emitting parts 12a and 12b such as laser devices are placed on the side of the light receiving surface of the integrated circuit device 1A. Openings 33a and 33b for optical paths are formed through the substrate 2A at positions above the light emitting parts 12a and 12b as the second openings.

Moreover, another integrated circuit device 34 is placed on the side of the back surface of the integrated circuit device 1A to be integral with the integrated circuit device 1A. The integrated circuit device 34, provided for executing processing of digital signals and the like, for example, is encapsulated with an encapsulation section 5A, together with the integrated circuit device 1A. A heat dissipating plate 35 as the heat dissipating member is interposed between the integrated circuit device 1A and the integrated circuit device 34. The heat dissipating plate 35 has a portion 35a exposed from the encapsulation section 5A. A heat dissipating plate 36 is placed in contact with the integrated circuit device 34, with the back surface thereof exposed from the encapsulation section 5A.

Furthermore, a hollow 13 defined by the encapsulation section 5A as the side wall is formed between the substrate 2A and the integrated circuit device 1A. A through hole 37 is formed through the encapsulation section 5A to allow the hollow 13 to communicate with the outside of the packaging structure. The through hole 37 has a function of cooling the hollow 13. When this packaging structure is used as a pickup, the axis of the through hole 37 is desirably roughly parallel to the movement direction of the pickup.

Each of the second openings 33a and 33b of the substrate 2A may be provided with a shutter 22 that can be opened/closed and blocks light emitted from the light emitting part 12a or 12b in its closed state. The shutter 22 is preferably composed of a liquid crystal material, for example.

As described above, according to the present invention, a practically suitable packaging structure can be provided for an integrated circuit device receiving short-wavelength laser light.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A packaging structure of an integrated circuit device having a photo detecting part, comprising:
    a substrate placed on the photo detecting part side of the integrated circuit device, the substrate being provided with at least one lead, said at least one lead being electrically connected with the integrated circuit device via an electrode; and
    an encapsulation section for encapsulating the integrated circuit device and the substrate,
    wherein the substrate has a first opening formed above the photo detecting part,
    wherein the integrated circuit device has a light emitting part on the side of its light receiving surface,
    wherein the substrate has a second opening formed above the light emitting part, and
    wherein the second opening is provided with a shutter that can be opened/closed and blocks light emitted from the light emitting part in its closed state.

2. The structure of claim 1, wherein the shutter is formed of a liquid crystal material.

* * * * *

UNITED STATES PATENT AND TRADEMARK OFFICE
CERTIFICATE OF CORRECTION

PATENT NO. : 7,663,200 B2  Page 1 of 1
APPLICATION NO. : 11/073726
DATED : February 16, 2010
INVENTOR(S) : Shirakawa et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 810 days.

Signed and Sealed this

Thirtieth Day of November, 2010

David J. Kappos
*Director of the United States Patent and Trademark Office*